US009362459B2

(12) United States Patent
Heikman et al.

(10) Patent No.: US 9,362,459 B2
(45) Date of Patent: Jun. 7, 2016

(54) HIGH REFLECTIVITY MIRRORS AND METHOD FOR MAKING SAME

(75) Inventors: Sten Heikman, Goleta, CA (US); Matthew Jacob-Mitos, Santa Barbara, CA (US); Ting Li, Ventura, CA (US); James Ibbetson, Santa Barbara, CA (US)

(73) Assignee: UNITED STATES DEPARTMENT OF ENERGY, Washington, DC (US)

( * ) Notice: Subject to any disclaimer, the term of this patent is extended or adjusted under 35 U.S.C. 154(b) by 509 days.

(21) Appl. No.: 12/553,025

(22) Filed: Sep. 2, 2009

(65) Prior Publication Data

US 2011/0049546 A1 Mar. 3, 2011

(51) Int. Cl.
*H01L 33/46* (2010.01)
*H01L 33/00* (2010.01)
*H01L 33/38* (2010.01)
H01L 33/60 (2010.01)
H01L 33/40 (2010.01)

(52) U.S. Cl.
CPC .............. *H01L 33/46* (2013.01); *H01L 33/387* (2013.01); *H01L 33/00* (2013.01); *H01L 33/0062* (2013.01); *H01L 33/405* (2013.01); *H01L 33/60* (2013.01)

(58) Field of Classification Search
CPC ..... H01L 31/162; H01L 33/00; H01L 33/062; H01L 33/46; H01L 33/465; H01L 33/60; H01L 33/387; H01L 33/405
USPC ......... 257/12–15, 79, 81–90, 94, 96, 98, 103, 257/183, 189, 198, 200, 414, 431, 432, 798, 257/E51.018, E31.01, E33.01, E33.023, 257/E33.025, E33.027
See application file for complete search history.

(56) References Cited

U.S. PATENT DOCUMENTS

| 1,393,573 A | 10/1921 | Ritter ............................ 362/509 |
| 1,880,399 A | 10/1932 | Benjamin |
| 2,214,600 A | 9/1940 | Winkler ........................ 362/279 |
| 2,981,827 A | 4/1961 | Orsatta .......................... 362/84 |

(Continued)

FOREIGN PATENT DOCUMENTS

| CN | 1841183 A | 10/2006 |
| CN | 1957481 | 5/2007 |

(Continued)

OTHER PUBLICATIONS

Huang et al. High-Performance GaN-Based Vertical-Injection Light-Emitting Diodes with TiO2-SiO2 Ohnidirectional Reflector and n-GaN Roughness. IEEE Photonics Technology Letters, vol. 19, No. 8, Apr. 15, 2007, pp. 565-567.*

(Continued)

*Primary Examiner* — Galina Yushina
(74) *Attorney, Agent, or Firm* — Koppel, Patrick, Heybl & Philpott (57) ABSTRACT

A composite high reflectivity mirror (CHRM) with at least one relatively smooth interior surface interface. The CHRM includes a composite portion, for example dielectric and metal layers, on a base element. At least one of the internal surfaces is polished to achieve a smooth interface. The polish can be performed on the surface of the base element, on various layers of the composite portion, or both. The resulting smooth interface(s) reflect more of the incident light in an intended direction. The CHRMs may be integrated into light emitting diode (LED) devices to increase optical output efficiency.

12 Claims, 7 Drawing Sheets

(56) References Cited

U.S. PATENT DOCUMENTS

| | | | |
|---|---|---|---|
| 2,981,927 A | 4/1961 | Orsatti et al. | |
| 3,395,272 A | 7/1968 | Nicholl | 362/305 |
| 4,420,800 A | 12/1983 | Van Horn | 362/297 |
| 4,946,547 A | 8/1990 | Palmour et al. | 156/643 |
| 5,018,157 A | 5/1991 | Deppe et al. | 372/45.013 |
| 5,200,022 A | 4/1993 | Kong et al. | 156/612 |
| RE34,861 E | 2/1995 | Davis et al. | 437/100 |
| 5,768,339 A | 6/1998 | O'Hara | 378/147 |
| 5,912,915 A * | 6/1999 | Reed et al. | 372/93 |
| 6,055,261 A | 4/2000 | Reed et al. | |
| 6,076,948 A | 6/2000 | Bukosky et al. | 362/494 |
| 6,111,276 A | 8/2000 | Mauk | 257/98 |
| 6,149,283 A | 11/2000 | Conway et al. | |
| 6,409,361 B1 | 6/2002 | Ikeda | 362/240 |
| 6,454,439 B1 | 9/2002 | Camarota | |
| 6,459,713 B2 | 10/2002 | Jewell | 372/46 |
| 6,552,369 B2 | 4/2003 | Chiou et al. | 257/98 |
| 6,558,032 B2 | 5/2003 | Kondo et al. | 362/516 |
| 6,563,141 B1 | 5/2003 | Dawson et al. | 257/98 |
| 6,585,397 B1 | 7/2003 | Ebiko | |
| 6,603,151 B2 | 8/2003 | Lin et al. | 257/98 |
| 6,657,236 B1 | 12/2003 | Thibeault et al. | 257/98 |
| 6,758,582 B1 | 7/2004 | Hsiao et al. | |
| 6,784,462 B2 | 8/2004 | Schubert | |
| 6,793,373 B2 | 9/2004 | Matsuba et al. | 362/260 |
| 6,797,987 B2 | 9/2004 | Chen | 257/98 |
| 6,812,502 B1 | 11/2004 | Chien et al. | 257/99 |
| 6,817,737 B2 | 11/2004 | Romano et al. | 362/293 |
| 6,833,565 B2 | 12/2004 | Su et al. | 257/98 |
| 6,840,652 B1 | 1/2005 | Hymer | |
| 6,967,981 B2 | 11/2005 | Chua et al. | 372/46 |
| 6,986,594 B2 | 1/2006 | Wirth et al. | |
| 6,995,402 B2 | 2/2006 | Ludowise et al. | 257/91 |
| 7,121,690 B1 | 10/2006 | Ramer et al. | |
| 7,148,514 B2 | 12/2006 | Seo et al. | 257/79 |
| 7,221,044 B2 | 5/2007 | Fan et al. | 257/676 |
| 7,261,454 B2 | 8/2007 | Ng | 362/555 |
| 7,321,126 B2 | 1/2008 | Singer et al. | 250/492 |
| 7,332,365 B2 | 2/2008 | Nakamura et al. | |
| 7,339,965 B2 | 3/2008 | Ledentsov et al. | 372/45 |
| 7,573,074 B2 | 8/2009 | Shum et al. | 257/99 |
| 7,622,746 B1 | 11/2009 | Lester et al. | 257/98 |
| 7,638,810 B2 | 12/2009 | Bour et al. | 257/98 |
| 7,784,977 B2 | 8/2010 | Moolman et al. | 362/298 |
| 8,118,451 B2 | 2/2012 | Householder et al. | 362/277 |
| 8,212,273 B2 | 7/2012 | McKenzie et al. | |
| 8,235,541 B2 | 8/2012 | Chen | 362/97 |
| 8,324,652 B1 | 12/2012 | Lester et al. | |
| 8,431,423 B2 | 4/2013 | Basin et al. | 438/26 |
| 8,492,785 B2 | 7/2013 | Hodota | 257/98 |
| 8,686,429 B2 | 4/2014 | Bergmann et al. | |
| 8,791,471 B2 | 7/2014 | Leung | 257/88 |
| 2003/0025212 A1 | 2/2003 | Bhat et al. | |
| 2003/0111667 A1 | 6/2003 | Schubert | |
| 2003/0210550 A1 | 11/2003 | Matsuba et al. | |
| 2004/0155565 A1 | 8/2004 | Holder et al. | 313/113 |
| 2004/0217362 A1 | 11/2004 | Slater et al. | |
| 2005/0063061 A1 * | 3/2005 | Grawert et al. | 359/586 |
| 2005/0168994 A1 | 8/2005 | Jacobson et al. | 362/319 |
| 2005/0211993 A1 | 9/2005 | Sano et al. | 257/79 |
| 2005/0225222 A1 | 10/2005 | Mazzochette et al. | 313/46 |
| 2005/0242358 A1 | 11/2005 | Tu et al. | |
| 2006/0006402 A1 | 1/2006 | Hsieh | |
| 2006/0039009 A1 * | 2/2006 | Kiesel et al. | 356/519 |
| 2006/0049411 A1 | 3/2006 | Nakamura et al. | |
| 2006/0060874 A1 | 3/2006 | Edmond et al. | 257/98 |
| 2006/0076568 A1 | 4/2006 | Keller et al. | 257/98 |
| 2006/0081858 A1 | 4/2006 | Lin et al. | |
| 2006/0163586 A1 | 7/2006 | Denbaars et al. | |
| 2006/0163589 A1 | 7/2006 | Fan et al. | 257/88 |
| 2006/0255358 A1 | 11/2006 | Shum | |
| 2006/0274805 A1 | 12/2006 | Song et al. | |
| 2006/0278885 A1 | 12/2006 | Tain et al. | |
| 2006/0292804 A1 | 12/2006 | Seo et al. | |
| 2007/0057270 A1 | 3/2007 | Bour et al. | 257/99 |
| 2007/0139923 A1 | 6/2007 | Negley | |
| 2007/0145380 A1 | 6/2007 | Shum et al. | |
| 2007/0217193 A1 | 9/2007 | Lin | |
| 2007/0217200 A1 | 9/2007 | Yang et al. | 362/277 |
| 2008/0035949 A1 | 2/2008 | Fudeta et al. | 257/99 |
| 2008/0061304 A1 | 3/2008 | Huang et al. | |
| 2008/0123341 A1 | 5/2008 | Chiu | |
| 2008/0144688 A1 | 6/2008 | Chua et al. | |
| 2008/0185609 A1 | 8/2008 | Kozawa et al. | |
| 2008/0191233 A1 | 8/2008 | Yang et al. | |
| 2008/0217634 A1 | 9/2008 | Liu | |
| 2008/0265268 A1 | 10/2008 | Braune et al. | 257/98 |
| 2008/0272391 A1 | 11/2008 | Kapur et al. | |
| 2009/0026478 A1 | 1/2009 | Yoon et al. | 257/98 |
| 2009/0029495 A1 | 1/2009 | Li et al. | 438/29 |
| 2009/0213591 A1 | 8/2009 | Katabe et al. | 362/236 |
| 2009/0231856 A1 | 9/2009 | Householder | |
| 2009/0283787 A1 | 11/2009 | Donofrio et al. | 257/98 |
| 2010/0001299 A1 | 1/2010 | Chang et al. | 257/89 |
| 2010/0012962 A1 | 1/2010 | Hong et al. | |
| 2010/0029023 A1 | 2/2010 | Neff et al. | 438/15 |
| 2010/0038659 A1 | 2/2010 | Chen et al. | |
| 2010/0039822 A1 | 2/2010 | Bailey | 362/296 |
| 2010/0051995 A1 | 3/2010 | Katsuno et al. | |
| 2010/0059785 A1 | 3/2010 | Lin et al. | |
| 2010/0065881 A1 | 3/2010 | Kim | |
| 2010/0103678 A1 | 4/2010 | Van de Ven et al. | 362/294 |
| 2010/0117099 A1 | 5/2010 | Leung | 257/88 |
| 2010/0117111 A1 | 5/2010 | Illek et al. | 257/98 |
| 2010/0140635 A1 | 6/2010 | Ibbetson et al. | |
| 2010/0155746 A1 | 6/2010 | Ibbetson et al. | |
| 2010/0158437 A1 * | 6/2010 | Decorby | 385/14 |
| 2010/0163900 A1 | 7/2010 | Seo et al. | 257/98 |
| 2010/0165633 A1 | 7/2010 | Moolman et al. | |
| 2010/0171094 A1 | 7/2010 | Lu et al. | 257/13 |
| 2010/0279437 A1 | 11/2010 | Neff et al. | 438/14 |
| 2010/0308354 A1 | 12/2010 | David et al. | 257/98 |
| 2010/0327295 A1 | 12/2010 | Peng et al. | 257/88 |
| 2011/0001148 A1 | 1/2011 | Sun et al. | 257/88 |
| 2011/0001412 A1 | 1/2011 | Zimmermann | 313/501 |
| 2011/0001422 A1 | 1/2011 | Aanegola et al. | 313/501 |
| 2011/0025190 A1 | 2/2011 | Jagt | 313/499 |
| 2011/0044027 A1 | 2/2011 | Chen | 362/97 |
| 2011/0075423 A1 | 3/2011 | Van De Ven | |
| 2011/0084294 A1 | 4/2011 | Yao | 257/93 |
| 2011/0182073 A1 | 7/2011 | Sanpei et al. | 362/294 |
| 2012/0086026 A1 | 4/2012 | Engl et al. | |
| 2014/0167065 A1 | 6/2014 | Bergmann et al. | |
| 2014/0312373 A1 | 10/2014 | Donofrio | |

FOREIGN PATENT DOCUMENTS

| | | |
|---|---|---|
| CN | 201007449 | 1/2008 |
| CN | 101103467 | 1/2009 |
| CN | 101449100 | 6/2009 |
| CN | 101460779 | 6/2009 |
| DE | 102004040277 | 2/2006 |
| DE | 102007003282 | 7/2008 |
| DE | 102008005497 | 7/2009 |
| DE | 102008035900 | 11/2009 |
| EP | 1750310 A2 | 2/2007 |
| EP | 2259345 A1 | 12/2010 |
| EP | 2369650 A2 | 9/2011 |
| JP | 06045649 | 2/1994 |
| JP | 06268252 | 9/1994 |
| JP | 200519728 | 7/2005 |
| JP | 2005197289 | 7/2005 |
| TW | 595689 | 5/2003 |
| TW | 595689 | 6/2004 |
| TW | M281297 | 11/2005 |
| TW | 200805717 | 1/2008 |
| TW | 200834991 | 8/2008 |
| WO | WO 00/34709 A1 | 6/2000 |
| WO | WO 2005/066539 A1 | 7/2005 |
| WO | WO 2005/078338 A1 | 8/2005 |
| WO | WO 2005078338 | 8/2005 |
| WO | WO 2005117152 | 12/2005 |
| WO | WO 2006/092697 A1 | 9/2006 |
| WO | WO 2007121739 | 1/2007 |

(56) References Cited

FOREIGN PATENT DOCUMENTS

| WO | WO 2007115040 | 10/2007 |
|---|---|---|
| WO | WO 2007/130536 A2 | 11/2007 |
| WO | WO 2008089324 A2 | 7/2008 |
| WO | WO 2008089324 A3 | 7/2008 |
| WO | WO 2008107654 | 9/2008 |
| WO | WO 2008149250 | 12/2008 |
| WO | WO 2009/056927 A1 | 5/2009 |
| WO | WO 2010/029475 A1 | 3/2010 |
| WO | WO 2010029475 | 3/2010 |
| WO | WO 2010151600 | 12/2010 |
| WO | WO 2011031098 A2 | 3/2011 |
| WO | WO 2011071100 A1 | 6/2011 |

OTHER PUBLICATIONS

Raoufi et al. Surface characterization and microstrucutre of ITO thin films at different annealing temperatures. Applied Surface Sceince 253 (2007), pp. 9085-9090.*
Lin et al. Enhancement of InGaN—GaN Indium—Tin—Oxide Flip-Chip Light-Emitting Diodes With TiO2—SiO2 Multilayer Stack Omnidirectional Reflector. IEEE Photonics Technology Letters, vol. 18, No. 19, Oct. 1, 2006, pp. 2050-2052.*
Sanchez et al. Ion and electron beam assisted growth of nanometric SimOn structures for near-field microscopy. Review of Scientific Instruments. vol. 73, # 11, 2002, pp. 3901-3907.*
International Search Report and Written Opinion for PCT/US2010/001851 mailed Nov. 11, 2010.
Huang, H. W., et al., High-Performance GaN-Based Vertical-Injection Light-Emitting Diodes with $TiO_2$—$SiO_2$ Omnidirectional Reflector and n-GaN Roughness, IEEE Photonics Technology Letters, vol. 19, No. 8, Apr. 15, 2007, pp. 565-567.
Wrzesinska H. et al. "Investigation of Indium Tin Oxide (ITO) Films for the VCSEL Laser with Dielectric Bragg Reflectors", Physica Status Solidi C Wiley-VCH Germany, No. 2, 2004, pp. C396-C400.
Choi Beomrak et al., "Surface Treatment of Indium Tin Oxide by SF6 Plasma for Organic Light-Emitting Diodes", Applied Physics Letters, AIP, American Institute of Physics, vol. 76, No. 4, Jan. 24, 2000 pp. 412-414.
Djurisic A. B. et al., "Asymmetric Bragg Mirrors for the Reduction of Emission Wavelength Dependence on the Viewing Angle in Organic Microcavity Light Emitting Diodes", Optics Communications, vol. 236, No. 4-6, Jun. 15, 2004, pp. 303-311.
International Search Report and Written Opinion for PCT Application No. PCT/US2011/001394 mailed Nov. 3, 2011.
DOM LED Downlighting, Lithonia Lighting: an Acuity Brands, Company, www.lithonia.com, © 2009.
Ecos, Lighting the Next Generation, gothan: a division of Acuity Brands Lighting Inc.. © 2008.
Renaissance Lighting brochure, © 2010.
International Search Report and Written Opinion for PCT Application No. PCT/US2010/002827 mailed May 2, 2011.
International Preliminary Report on Patentability from Application No. PCr/US09/66938, dated Apr. 3, 2012.
International Search Report and Written Opinion for Application No. PCT/US2012/034564, dated Sep. 5, 2012.
Cree® EZ700™ LED Data Sheet, 2007 Cree's EZBright™.
Cree® EZ1000™ LEDs Data Sheet, 2007 Cree's EZBright™.
Cree® EZBright290™ LED Data Sheet, 2007 Cree's EZBright™.
CREE® EZ400™ LED Data Sheet, 2007 pp. 1-5 Cree's EZBright™.
Windisch et al. "Impact of Texture-Enhanced Transmission on High-Efficiency Surface-Textured Light-Emitting Diodes", Applied Physics Letters vol. 79, No. 15, Oct. 8, 2001, pp. 2315-2317.
Schnitzer et al. "30% External Quantum Efficiency From Surface Textured, Thin-Film Light-Emitting Diodes", 320 Applied Physics Letters 63(1993) Oct. 18, No. 16, pp. 2174-2176.
Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.
Streubel, et al. "High Brightness AlGaInP Light-Emitting Diodes", IEEE Journal on Selected Topics in Quantum Electronics, vol. 8, No. 2 Mar./Apr. 2002, pp. 321-332.
Huang et al. "High-Performance GaN-Based Vertical-Injection Light-Emitting Diodes with $TiO_2$-$SiO_2$ Omnidirectional Reflector and n-GaN Roughness", IEEE Photonics Technology Letters, vol. 19, No. 8, Apr. 15, 2007, pp. 565-567.
Related U.S. Appl. No. 12/316,097 to Ibbetson, filed Dec. 8, 2008.
Office Action from U.S. Appl. No. 12/418,796, Dated: Jul. 20, 2011.
Office Action from U.S. Appl. No. 12/329,722, Dated: Oct. 27, 2010.
Office Action from U.S. Appl. No. 12/855,500, dated May 31, 2013.
Response to OA from U.S. Appl. No. 12/855,500, filed Sep. 3, 2013.
Office Action from U.S. Appl. No. 13/071,349, dated May 28, 2013.
Response to OA from U.S. Appl. No. 13/071,349, filed Jul. 18, 2013.
Office Action from U.S. Appl. No. 13/071,349, dated Jan. 17, 2013.
Response to OA from U.S. Appl. No. 13/071,349, filed Apr. 10, 2013.
Huang et al. High-Performance GaN-Based Vertical-Injection Light-Emitting Diodes with TiO2—Sio2 Ohnidirectional Reflector and n-GaN Roughness. IEEE Photonics Technology Letters, vol. 19, No. 8, Apr. 15, 2007, pp. 565-567.
Raoufi et al. Surface characterization and microstructure of ITO thin films at different annealing temperatures. Applied Surface Science 253 (2007). pp. 9085-9090.
Office Action from U.S. Appl. No. 13/168,669, dated Jun. 28, 2013.
Office Action from U.S. Appl. No. 12/757,179, dated Dec. 31, 2012.
Response to OA from U.S. Appl. No. 12/757,179, filed Apr. 23, 2013.
Office Action from U.S. Appl. No. 13/415,626, dated Feb. 28, 2013.
Response to OA from U.S. Appl. No. 13/415,626, filed Apr. 17, 2013.
Kobayash et al. "Optical Investigation on the Growth Process of GaAs . . . ". 1989 Japanese Journal of Applied Physics, vol. 28, No. 11 pp. L1880-L1882, Nov. 1989.
Office Action from U.S. Appl. No. 12/606,377, dated Nov. 26, 2012.
Response to OA from U.S. Appl. No. 12/606,377, filed Feb. 22, 2013.
Notice of Reasons for Rejection from Japanese Patent Appl. No. 2011-539526, dated Jun. 25, 2013.
First Office Action and Search Report from Chinese Patent Appl. No. 201080023107.8, dated Jul. 12, 2013.
International Search Report and Written Opinion from PCT Application No. PCT/US2013/028684, dated May 28, 2013.
Jong Kyu kim, et al., "GaInN Light-emitting Diodes with RuO2/SiO2/Ag Omni-directional Reflector", Applied Physics Letters, AIP, American Institute of Physics, Nelville, NY, US, vol. 84, No. 22, May 31, 2004, pp. 4508-4510.
Y.S. Zhao, et al., "Efficiency Enhancement of InGaN/GaN Light-Emitting Diodes with a Back-Surface distributed Bragg Reflector", Journal of Electronic Materials, vol. 32, No. 12, Dec. 1, 2003, pp. 1523-1526, XP055063308.
Xu Qing-tao, et al., "Enhancing Extraction Efficiency from GaN-based LED by Using an Omni-directional Reflector and Photonic Crystal", Optoelectronics Letters, vol. 5, No. 6, Nov. 1, 2009, pp. 405-408, XP055063309.
J.-Q Xi, et al., "Optical Thin-film Materials with Low Refractive Index for Broadband Elimination of Fresnel Reflection", Nature Photonics, Nature Publishing Group, UK, vol. 1. No. 3, Mar. 1, 2007, pp. 176-179, XP002590687.
Decision of Patent Grant from Japanese Patent Appl. No. 2011-539526, dated Oct. 22, 2013.
Examination Report from European Patent Appl. No. 10774320.5-1757, dated Sep. 5, 2014.
Second Office Action from Chinese Patent Appl. No. 2011800470694, dated Aug. 6, 2014.
International Preliminary Report on Patentability from Appl. No. PCT/US2013/028684, dated Sep. 18, 2014.
First Office Action from Chinese Patent Application No. 2009-801492034, dated Jun. 24. 2014.
First Office Action and Search Report from Chinese Patent Appl. No. 2009-801492053, dated Jun. 20, 2014.
Office Action from U.S. Appl. No. 12/757,179, dated Jul. 15, 2014.
Office Action from U.S. Appl. No. 13/909,927, dated Aug. 8, 2014.
Third Office Action from Chinese Appl. No. 201080023107.8, dated Sep. 29, 2014.
Communication from European Appl. No. 13709035.3-1551, dated Oct. 15, 2014.

(56) References Cited

OTHER PUBLICATIONS

Office Action from U.S. Appl. No. 12/606,377, dated Sep. 3, 2014.
Response to OA from U.S. Appl. No. 12/606,377, filed Oct. 23, 2014.
Office Action from U.S. Appl. No. 13/370,696, dated Aug. 27, 2014.
Second OA from Chinese Patent Appl. No. 201080023107.8, dated Mar. 7, 2014.
Office Action from U.S. Appl. No. 12/757,179, dated Mar. 11, 2014.
Office Action from U.S. Appl. No. 13/909,927, dated Apr. 2, 2014.
Office Action from U.S. Appl. No. 12/606,377, dated Apr. 9, 2014.
First Office Action from Japanese Patent Appl. No. 201180047069.4, dated: Dec. 18, 2013.
Search Report from Japanese Patent Appl. No. 201180047069.4, dated: Dec. 18, 2013.
Comments on the Written Opinion and Amendment of the Application from European Patent Appl. No. 12723543.0, dated Feb. 21, 2014.
Office Action from U.S. Appl. No. 12/855,500, dated Dec. 4, 2013.
First Office Action from Chinese Patent Appl. No. 201180047069.4, dated Dec. 18, 2013.
Second Office Action from Chinese Patent Appl. No. 2009801492034, dated Jan. 6, 2015.
Office Action and Search Report from Taiwanese Patent Appl. No. 10420278720, dated Mar. 9, 2015.
Office Action from U.S. Appl. No. 14/185,589, dated Feb. 19, 2015.
Office Action from U.S. Appl. No. 12/606,377, dated Mar. 2, 2015.
Office Action from U.S. Appl. No. 14/219,916, dated Mar. 6, 2015.
Su, et al., "Nitride-Based LED's with n-GaN Current Spreading Layers", 2005, IEEE Electron Devices Letters, vol. 26. No. 12, pp. 891-893; Dec. 2005.
Office Action from Chinese Patent Appl. No. 200980149205.3, dated Mar. 11, 2015.
Rejection Decision Chinese Patent Appl. No. 201080023107.8, dated Mar. 19, 2015.
Office Action from Taiwanese Patent Appl. No 099110005, dated Mar. 26, 2015.
Examiner's Report from European Patent Appl. No. 10 774 320.5-1757, dated Feb. 10, 2015.
European Examination Report from European Patent Appl. No. 10 725 524.2-1757, dated Nov. 3, 2014.
Search Report from Taiwanese Appl. No. 099121883, dated Oct. 2, 2014.
Huang, et al. , "High-Performance GaN-Based Vertical-Injection Light-Emitting Diodes With TiO2—SiO2 Omnidriectional Reflector and n-GaN Roughness", IEEE Photonics Technology Letters, vol. 19, No. 8, Apr. 15, 2007.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13/028,946, filed Dec. 15, 2014.
Office Action from U.S. Appl. No. 14/219,916, dated Oct. 29, 2014.
Office Action from U.S. Appl. No. 13/909,927, dated Nov. 6, 2014.
Office Action from Taiwanese Patent Appl. No. 099110005, dated Mar. 23, 2015.
Third Office Action from Chinese Appl. No. 2011800470694, dated Apr. 29, 2015.
Office Action from U.S. Appl. No. 13/909,927, dated Apr. 23, 2015.
Examination Report from European Appl. No. 10 725 524.2-1757, dated Jun. 19, 2015.
Third Office Action from Chinese Appl. No. 200980149203.4, dated Jul. 3, 2015.
Notice of Allowance from Taiwanese Patent Appl. No. 099110005, dated Jul. 20. 2015.
Office Action from U.S. Appl. No. 14/219,916, dated Jun. 17, 2015.
Margalit et al. "64o C Continuous-Wave Operation of 1.5-um Vertical Cavity Laser", 1997, IEEE Journal od Selected Topics in Quantum Electronics, vol. 3, pp. 359-365.
Office Action from U.S. Appl. No. 14/185,589, dated Jul. 28, 2015.
Office Action from U.S. Appl. No. 14/050,001, dated Jul. 30, 2015.
Office Action and Search Report from Taiwanese Patent Appl. No. 10421191660. dated Sep. 2, 2015.
Notice of Issuance from Chinese Patent Application No. 200980149205 3. dated Sep. 24, 2015.
Examination from European Paten: Appl. No. 09836676.8, dated Oct. 26, 2015.
Office Action Summary from Korean Patent Appl. No. 10-2011-7015872, dated Nov. 6, 2015.
Office Action from Taiwanese Patent Appl. No. 099136758, dated Oct. 26, 2015.
Office Action from U.S. Appl. No 12/606,377. dated Sep. 18, 2015.
Certificate of Invention from Chinese Patent appl. No. 200980149205.3, dated Dec. 16, 2016.
Notification of Allowance from Chinese Patent Appl. No. 200980149203.4, dated Dec. 4, 2015.
Notification of Reexamination from Chinese Patent appl. No. 201080023107.8, dated Dec. 2, 2015.
Office Action from Chinese Patent appl. No. 201180047069.4, dated Dec. 24, 2015.
Examination Report from European Patent Appl. No. 10 774 320.5, dated Jan. 8, 2016.
First Office Action from Chinese Patent appl. No. 2012800412299, dated Dec. 16, 2015.
Comments on the Written Opinion and Amendment from European Patent Appl. No. 14733925.3, dated Jan. 14, 2016.
Examination from European Patent Appl. No. 10 725 524.2-1757, dated Feb. 3, 2016.
Office Action from U.S. Appl. No. 14/050,001: Jan. 29, 2016.

\* cited by examiner

| ITO THICKNESS (nm) | ITO ABSORBTION (%) | ITO ETCH TIME (min) | RMS ROUGHNESS (nm) | $R_{sheet}$ (Ohm/sq) | REFLECTIVITY (%) |
|---|---|---|---|---|---|
| 110 | 0.57 | NO ETCH | 9.07 | 39 | 90.9 |
| 110 | 0.62 | 20 | 3.87 | 39 | 92.6 |
| 110 | 0.64 | 50 | 1.93 | 42 | 95.3 |
| 55 | 0.21 | NO ETCH | 1.99 | 64 | 95.5 |
| 55 | 0.27 | 20 | 0.78 | 77 | 97.0 |
| 55 | 0.26 | 50 | 0.42 | 104 | 97.2 |

| WAFER | ITO THICKNESS (A) | POLISH ETCH | RMS ROUGHNESS (nm) | LAMP AVERAGES AT 350mA | |
|---|---|---|---|---|---|
| | | | | OUTPUT POWER (a.u.) | WAVELENGTH (nm) |
| W1-TOP | 500 | NO | 5.65 | 50.9 | 458.0 |
| W1-BOTTOM | 500 | YES | 1.43 | 55.3 | 452.5 |
| W2-TOP | 1000 | NO | 11.2 | 49.5 | 449.0 |
| W2-BOTTOM | 1000 | YES | 2.24 | 55.7 | 448.0 |
| W3-TOP | 500 | NO | 5.85 | 57.0 | 465.0 |
| W3-BOTTOM | 500 | YES | 1.59 | 63.4 | 456.5 |
| W4-TOP | 1000 | NO | 12 | 56.4 | 462.5 |
| W4-BOTTOM | 1000 | YES | 2.44 | 61.0 | 459.0 |
| W7-TOP | 500 | NO | 5.84 | 50.0 | 448.0 |
| W7-BOTTOM | 500 | YES | 1.13 | 57.2 | 452.0 |

HIGH REFLECTIVITY MIRRORS AND METHOD FOR MAKING SAME

This invention was developed with Government support under National Energy Technology Laboratory Contract No. DE-FC26-07NT43225. The Government has certain rights in this invention.

BACKGROUND OF THE INVENTION

1. Field of the Invention

This invention relates to composite high reflectivity mirrors and, more particularly, to such mirrors with one or more polished interior surfaces and methods for making the same.

2. Description of the Related Art

Light emitting diodes (LED or LEDs) are solid state devices that convert electric energy to light, and generally comprise one or more active layers of semiconductor material sandwiched between oppositely doped n-type and p-type layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency. One way that emission efficiency can be measured is by the emission intensity in relation to the input power in units of lumens per watt. One way to maximize emission efficiency is by increasing extraction of light emitted by the active region of LEDs. For conventional LEDs with a single out-coupling surface, the external quantum efficiency can be limited by total internal reflection (TIR) of light from the LED emission region. TIR can be caused by the large difference in the refractive index between the LED semiconductor and the surrounding ambient. Some LEDs have relatively low light extraction efficiencies due to the high index of refraction of the substrate compared to the index of refraction for the surrounding material, such as epoxy, for example. This difference results in a small escape cone from which light rays from the active area can transmit from the substrate into the epoxy and ultimately escape the LED package. Light that does not escape can be absorbed in the semiconductor material or at surfaces that reflect the light.

Different approaches have been developed to reduce TIR and improve overall light extraction. One popular approach is surface texturing. Surface texturing increases the light escape probability by providing a varying surface that allows photons multiple opportunities to find an escape cone. Light that does not find an escape cone continues to experience TIR and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. 30% *External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaInP Light Emitting Diodes*, IEEE Journal on Selected Topics in Quantum Electronics, Vol. 8, No. March/April 2002].

U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly can be encapsulated in a clear protective resin 14, which may be molded in the shape of a lens to collimate the light emitted from the LED chip 12. While the reflective cup 13 may direct light in an upward direction, optical losses occur when the light is reflected. Some light may be absorbed by the reflector cup due to the less than 100% reflectivity of practical reflector surfaces. Some metals can have less than 95% reflectivity in the wavelength range of interest.

Figures 1, 2, 3:
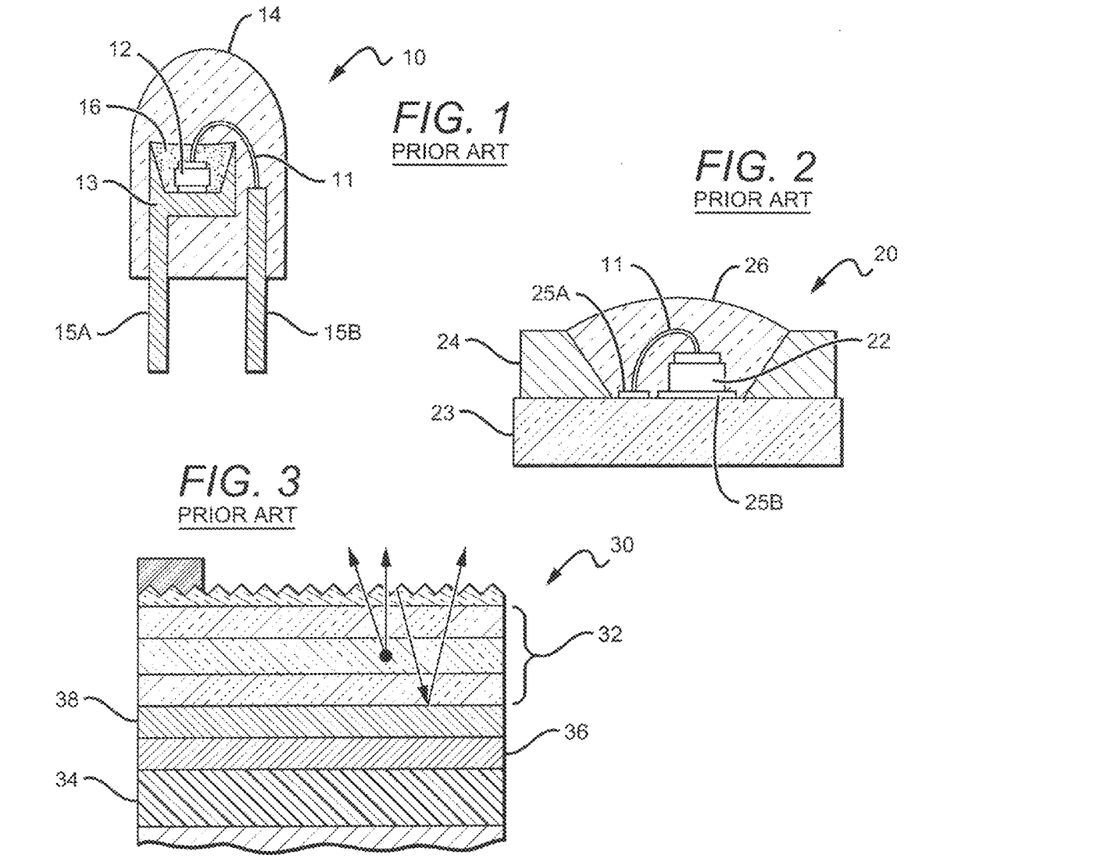
FIG. 1 is a sectional view of one embodiment of a prior art LED lamp.
FIG. 2 is a sectional view of one embodiment of a prior art LED lamp.
FIG. 3 is a sectional view of one embodiment of a prior art LED chip.

FIG. 2 shows another LED package in which one or more LED chips 22 can be mounted onto a carrier such as a printed circuit board (PCB) carrier, substrate or submount 23. A metal reflector 24 mounted on the submount 23 surrounds the LED chip(s) 22 and reflects light emitted by the LED chip 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The metal reflector 24 may also experience optical losses when the light is reflected because it also has less than 100% reflectivity.

The reflectors shown in FIGS. 1 and 2 are arranged to reflect light that escapes from the LED. LEDs have also been developed having internal reflective surfaces to reflect light internally. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 can reflect light emitted from the LED chip toward the submount back toward the LED primary emitting surface. The reflector also reflects TIR light back toward the LED primary emitting surface. Like the metal reflectors above, reflector 38 reflects less than 100% of light and in some cases less than 95%. The reflectivity of a metal film on a semiconductor layer may be calculated from the optical constants associated with the materials using thin film design software such as TFCalc™ from Software Spectra, Inc. (www.sspectra.com).

Figure 4:
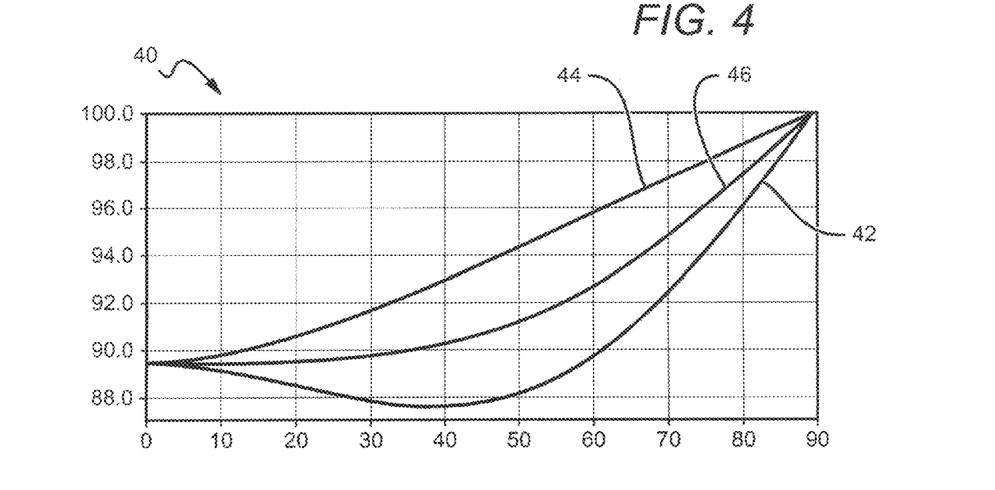
FIG. 4 is a graph showing the calculated reflectivity of a metal reflector at different viewing angles.

FIG. 4 shows a graph 40 showing the calculated reflectivity of Ag on gallium nitride (GaN) at different viewing angles for light with a wavelength of 460 nm. The refractive index of GaN is taken to be 2.47, a value known in the art, while the complex refractive index for silver is also known in the art. The graph shows the p-polarization reflectivity 42, s-polarization reflectivity 44, and average reflectivity 46, with the average reflectivity 46 generally illustrating the overall reflectivity of the metal for the purpose of LEDs where light is generated with random polarization. The reflectivity at 0 degrees is lower than the reflectivity at 90 degrees, and this difference can result in 5% or more of the light being lost (i.e., absorbed) on each reflection. In an LED chip, TIR light can reflect off the mirror several times before it escapes, and, as a result, small changes in the mirror reflectivity can lead to significant changes in the brightness of the LED. The cumulative effect of the mirror absorption on each reflection can reduce the light intensity such that less than 75% of light from the LED active region actually escapes as LED light. Thus, it is desirable to have a mirror whose reflectivity is as high as possible, exceeding that of Ag.

SUMMARY OF THE INVENTION

A method for fabricating a highly reflective element according an embodiment of the present invention comprises the following steps (in no particular order). A base element is provided. At least one transparent dielectric layer is deposited on the base element, the at least one dielectric layer having a first index of refraction that is smaller than the base index of refraction. A reflective cap layer is deposited on the at least one transparent dielectric layer opposite the base element. At least one internal surface of the highly reflective element is polished.

A composite high reflectivity mirror (CHRM) according to one embodiment of the present invention comprises the following elements. At least one transparent dielectric layer is on a base element. A reflective cap layer is on the at least one transparent dielectric layer opposite the base element. At least one interior surface of the CHRM is polished.

A light emitting diode (LED) according to one embodiment of the present invention comprises the following elements. A current spreading layer having a polished surface is on a light emitting structure. At least one dielectric layer is on the polished surface of the current spreading layer opposite the light emitting structure. A reflective cap layer is on the at least one dielectric layer opposite said current spreading layer.

BRIEF DESCRIPTION OF THE DRAWINGS

FIG. 9b is a graph of ITO roughness (nm) versus reflectivity (%) using data from the table in FIG. 9a.

FIGS. 12(a-d) are cross-sectional views of an LED device according to an embodiment of the present invention in various stages of fabrication.

DETAILED DESCRIPTION OF THE INVENTION

The present invention as embodied in the claims is directed to composite high reflectivity mirrors (CHRMs) with at least one relatively smooth interior surface interface. CHRMs are particularly well-suited for use in solid state light emitting devices such as LEDs or laser diodes. CHRM devices are discussed in detail in U.S. patent application Ser. No. 12/316, 097 by Ibbetson, et al. which is commonly assigned with the present application to Cree, Inc., and which is incorporated by reference as if fully set forth herein. The CHRM materials may be used as contacts or layers arranged within the emitter devices to increase emission efficiency. Embodiments of the present invention are described herein with reference to LEDs, but it is understood that the concepts are equally applicable to other types of emitters. Embodiments of the present invention can be used as reflectors in conjunction with one or more contacts or can be used as a reflector separate from the contacts.

The improved reflectivity of the CHRM reduces optical losses that can occur in reflecting light that is emitted from the active region in a direction away from useful light emission, such as toward the substrate or submount. The CHRM also reduces losses that can occur when TIR light is reflecting within the LED. Embodiments of the present invention provide various unique combinations of layers that can comprise a CHRM wherein at least one of the layers is polished to form a smooth surface. The CHRM can be in many different locations such as on an outer surface of the LED or internal to the LED. When used with LEDs, the CRHM can be applied to both chip and/or package surfaces. The CHRM structure may also be applied to other surfaces such as a reflector cup.

Recent research indicates that small scale roughness, such as a root mean square (RMS) roughness of around 10 nm, of some of the layers within the CHRM is reducing the reflectivity of the CHRM. For optimum performance of the CHRM, the respective interfaces between the various component layers need to be smooth, with an RMS roughness of less than 2 nm and preferably less than 1 nm. Thus, a CHRM structure having optically smooth interfaces is disclosed herein as well as methods which can be used to polish various layer surfaces to achieve the smooth interface structure.

Different embodiments of the invention also provide LEDs having conductive via or path arrangements that provide conductivity through the CHRM structure. This allows an electric signal to pass through the CHRM along the vias so that the CHRM can be used as an internal layer within an LED device or the like. This via arrangement can take many different shapes and sizes as described below.

The present invention is described herein with reference to certain embodiments; however, it is understood that the invention can be embodied in many different forms and should not be limited to the embodiments set forth herein. In particular, the CHRM can comprise many different layers of different material with many different thicknesses beyond those described herein. The CHRM can be disposed in many different locations on different solid state emitters beyond those described herein. Further, the CHRM can be provided with or without conductive structures to allow electrical signals to pass through. One or more polished surfaces may be disposed between layers within the device, other than those explicitly discussed.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or region to another layer or region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. The figures are not drawn to scale. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions/layers illustrated in the figures are schematic in nature. Their shapes are not intended to illustrate the precise shape of a region/layer of a device and are not intended to limit the scope of the invention.

Figure 5:
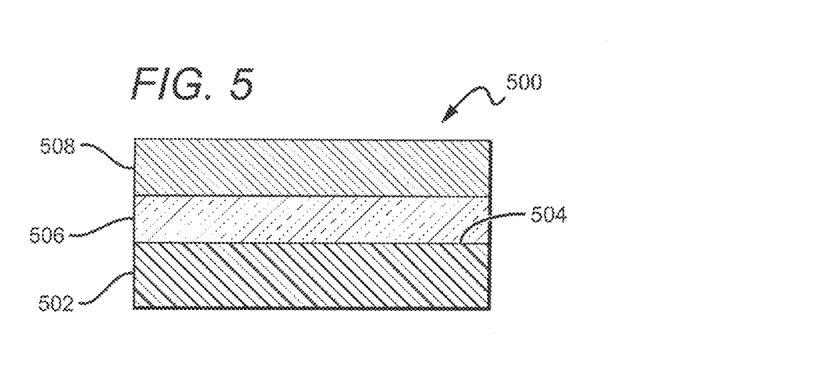
FIG. 5 is a cross-sectional view of a CHRM device according to an embodiment of the present invention.

FIG. 5 is a cross-sectional view of a CHRM 500 according to an embodiment of the present invention. A base element 502 having a polished surface 504 is provided. At least one transparent dielectric layer 506 is deposited on the base element 502. A reflective cap layer 508 is deposited on the transparent dielectric layer 506 opposite the base element 502. The CHRM 500 can comprise these layers as the basic mirror stack. In other embodiments, the dielectric layer can be replaced by or integrated with a hybrid dielectric/metal stack or a Bragg mirror stack, for example.

The base element 502 can comprise many different structures. In one embodiment the base element 502 comprises a current spreading layer, such as indium tin oxide (ITO), for example. This embodiment is particularly well-suited for use in LED structures. In an LED, the current spreading layer can be disposed on a substrate opposite the semiconductor layers including a light emitting active region. In this configuration, the CHRM 500 can be used to reflect light from the active region back toward the intended direction of emission, reducing the percentage of light that is absorbed by other elements within the LED chip/package. Although CHRMs designed for use in LEDs are discussed in detail herein, it is understood that CHRM devices have applications that range far beyond their use in LEDs. The base element 502 can comprise any transmissive structure on which the dielectric layer 506 can be deposited. In some embodiments, for example, the dielectric layer 506 may be deposited on a substrate, such as sapphire or silicon carbide (SiC) or GaN, without an intermediate current spreading layer.

Figure 6A:
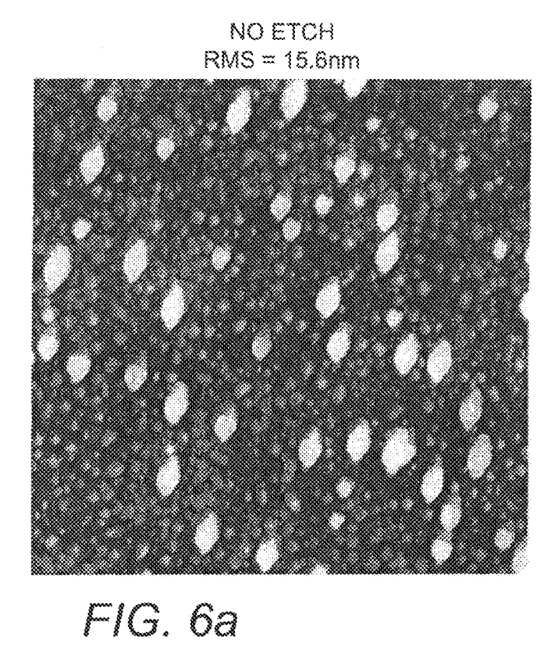
FIG. 6a is a top view taken from an atomic force microscope of an ITO film on a sapphire substrate prior to a polishing treatment.
Figure 6B:
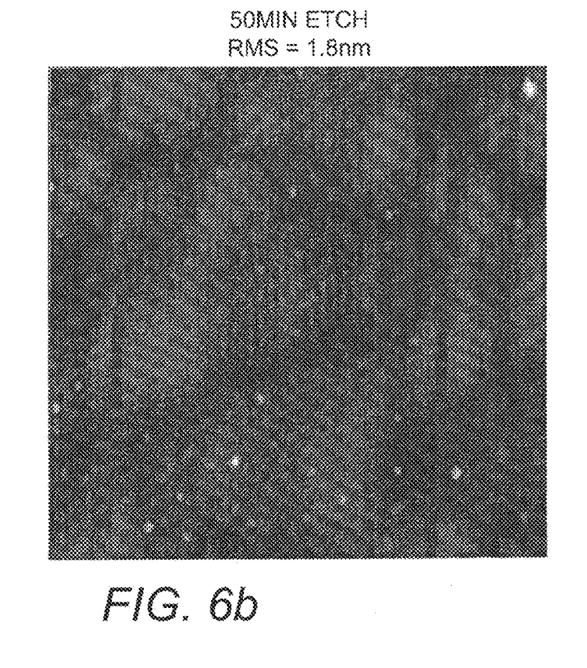
FIG. 6b is a top view taken from an atomic force microscope of an ITO film on a sapphire substrate after a polishing treatment.

One or more surfaces of the base element may be polished prior to the deposition of the dielectric layer(s). The surface 504 of the base element 502 is polished to reduce roughness as illustrated in FIG. 6. For good performance, the surface 504 should be polished to have a root mean square (RMS) roughness of less than approximately 2 nm, and preferably less than approximately 1 nm.

Many different processes may be used to polish one of the internal surfaces of the device during fabrication. Several known treatments may be used for the polish such as a mechanical process, chemical mechanical planarization (CMP), plasma etching, ion beam etching, or wet etching, for example. Different processes may work better for different materials. In some embodiments, the base element 502 comprises an ITO layer. In this case, one or more of the ITO layer surfaces may be polished using a sulfur hexafluoride and argon ($SF_6$/Ar) plasma etch. In other embodiments, it may be desirable to polish the surface of an $SiO_2$ layer, in which case an ion plasma etching process with Ar may be suitable. Many different polish processes may be used to achieve a particular smoothness on one of the internal surfaces of the CHRM 500. These processes may be implemented as an intermediate step during deposition process, or they be implemented prior to any deposition steps as in the case where a substrate is treated prior to deposition of any layers thereon (e.g., current spreading layers or dielectric layers).

Various types of equipment can be used to perform a polish etch. The equipment may be divided into two categories: ex-situ and in-situ.

Ex-situ equipment can be used to perform the polish etch, but generally cannot be used to deposit any of the CHRM layers. That is, when using ex-situ equipment, the film deposition and the polish etch have to be performed in different equipment. Some examples of ex-situ equipment are: reactive ion etchers, inductively coupled reactive ion etchers, and plasma etchers.

On the other hand, in-situ equipment can be used to perform a polish etch and deposit CHRM layers. Thus, using an in-situ process, a film can be deposited and polished, and then additional films can be deposited all without unloading the sample from the equipment. Furthermore, in some in-situ equipment, the polish etch can be done concurrently with the deposition, in which case the polish etch keeps the film roughness to an acceptable level without interrupting the deposition process. Some examples of in-situ equipment are: e-beam evaporators with an ion gun, sputter deposition tools with wafer RF backsputter capability, and plasma enhanced (or inductively coupled plasma enhanced) CVD tools.

FIGS. 6(a,b) show scanned images from an atomic force microscope of an unpolished ITO film (6a) and a polished ITO film (6b). Both figures show the surface of a 100 nm ITO film which has been deposited on a sapphire substrate. Similar results have been obtained for ITO films on GaN and silicon. FIG. 6a shows the film prior to polishing. The unpolished surface has an RMS roughness of 15.6 nm. FIG. 6b shows the same film after being exposed to an $SF_6$/Ar plasma etch for 50 minutes. The polished surface has an RMS roughness of 1.8 nm. Many different methods may be used to polish the surface as previously discussed. While it is possible to achieve unpolished ITO films that have RMS roughness of 2 nm or less, in the absence of a polish step it has been found to be difficult to achieve smooth films simultaneously possessing other desirable characteristics, such as low absorption, low resistivity, and low contact resistance to GaN.

Referring again to FIG. 5, a reflective cap layer 508 is disposed on the dielectric layer 506. The reflective cap layer 508 can have many different thicknesses and can comprise many different reflective materials, with some suitable materials being Ag, Al, Au, and alloys and combinations thereof. The choice of material can depend on many factors with one being the wavelength of light being reflected. In embodiments for use in blue LED structures, the reflective cap layer 508 can comprise Ag having a thickness of approximately 200 nm. In other embodiments the reflective cap layer 508 can comprise composite metal layers such as TiAg, NiAg, CuAg, or PtAg, for example, and in some embodiments these composite layers can provide improved adhesion to the underlying dielectric layer 506. A thin layer of material such as indium tin oxide (ITO), Ni, Ti or Pt may also be included between the dielectric layer 506 and the reflective cap layer 508 to improve adhesion.

Figure 7:
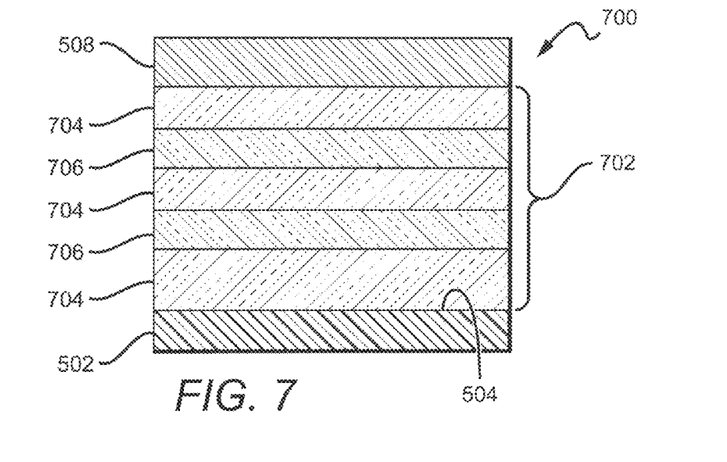
FIG. 7 is a cross-sectional view of a CHRM device according to an embodiment of the present invention.

FIG. 7 shows a cross-sectional view of a CHRM 700 according to an embodiment of the present invention. In this particular embodiment the dielectric layer 702 comprises a stack of multiple layers of different dielectric materials. It is understood that many different materials, thicknesses and arrangements can be used. A first material 704 is provided on the base element 502. The first layer 704 can comprise many different materials, with a suitable material comprising a transparent dielectric. Some dielectric materials that can be used are SiN, SiO2, Si, Ge, MgOx, MgNx, ZnO, SiNx, SiOx, and alloys or combinations thereof. The layer of the first material 704 closest to the base element 502 should be relatively thick to provide a reliable viewing angle cut-off point after which the reflectivity of the CHRM 700 is approximately 100%. In one embodiment used with a blue emitting LED, the first material 704 can comprise $SiO_2$ and have a thickness in the range of 500-650 nm, with one embodiment having a thickness of approximately 591 nm.

To improve reflectivity at lower viewing angles and to improve the angle averaged reflectivity (AAR), the dielectric layer 702 can also comprise a layer or layers of a second material 706, with the first and second materials 704, 706 having different indices of refraction. In various embodiments different materials can be used for the layers and a different number of layers can be included, with the embodiment shown in FIG. 7 having three layers of the first material 704 comprising $SiO_2$ and two layers of the second material 706 comprising $TiO_2$. $SiO_2$ has an index of refraction of approximately 1.46, while $TiO_2$ has an index of refraction of approximately 2.34. The three $SiO_2$ layers can have different thicknesses, and the two $TiO_2$ layers can have different thicknesses. This provides a composite dielectric layer 702 that is different from standard distributed Bragg reflectors (DBRs) where the layers of different materials have the same thickness. One such example of this type of DBR is a ¼ wavelength DBR where each of the $SiO_2$ and $TiO_2$ layers can have essentially the same optical thickness approximately equal to a ¼ wavelength of the light. In another embodiment of the dielectric layer, tantalum pentoxide ($Ta_2O_5$) can be used in place of $TiO_2$.

Figure 8:
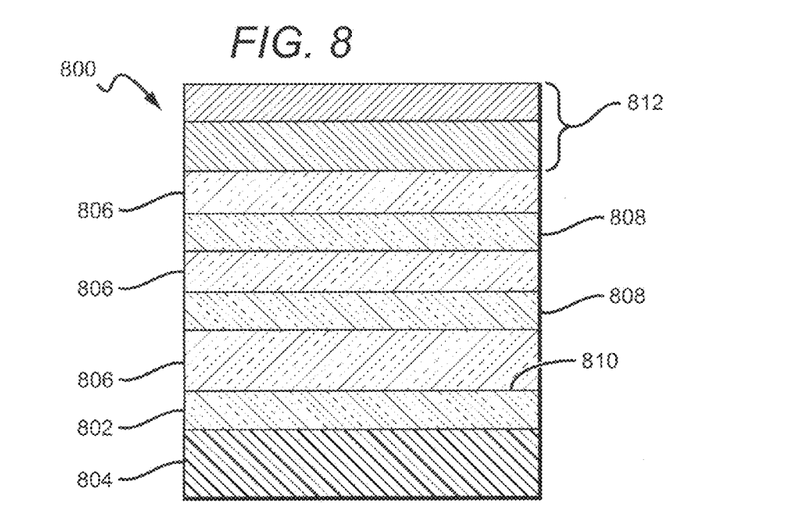
FIG. 8 is a cross-sectional view of a CHRM device according to an embodiment of the present invention.

FIG. 8 shows a cross-sectional view of a CHRM 800 according to an embodiment of the present invention. The base element 802 comprises an ITO layer which is disposed on a sapphire substrate 804. In this particular embodiment, the first material layers 806 comprise $SiO_2$ and the second material layers 808 comprise $Ta_2O_5$. The first and second material layers 806, 808 are arranged in an alternating configuration. The layers of the respective materials 806, 808 are thicker close to the base element 802. The first and second material layers 806, 808 are deposited on a polished surface 810 of the ITO layer 802 in the following arrangement (shown in FIG. 8) starting with the layer closest to the ITO layer 802 and moving outward: $SiO_2$ (522 nm), $Ta_2O_5$ (86 nm), $SiO_2$ (95 nm), $Ta_2O_5$ (65 nm), $SiO_2$ (48 nm). The reflective cap layer 812 is deposited on the first and second material layers 806, 808 and comprises a layer of Ag (200 nm) and a layer of TiW (100 nm).

Many other material combinations and layer thicknesses/arrangements are also possible without departing from the scope of the invention as claimed.

Figure 9A:
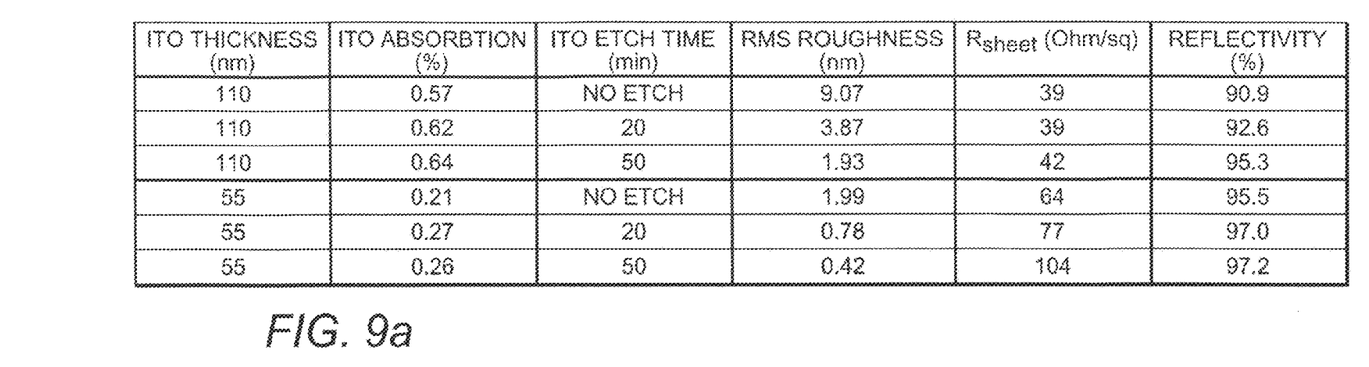
FIG. 9a is a table of data related to roughness and reflectivity of various different CHRM devices.
Figure 9B:
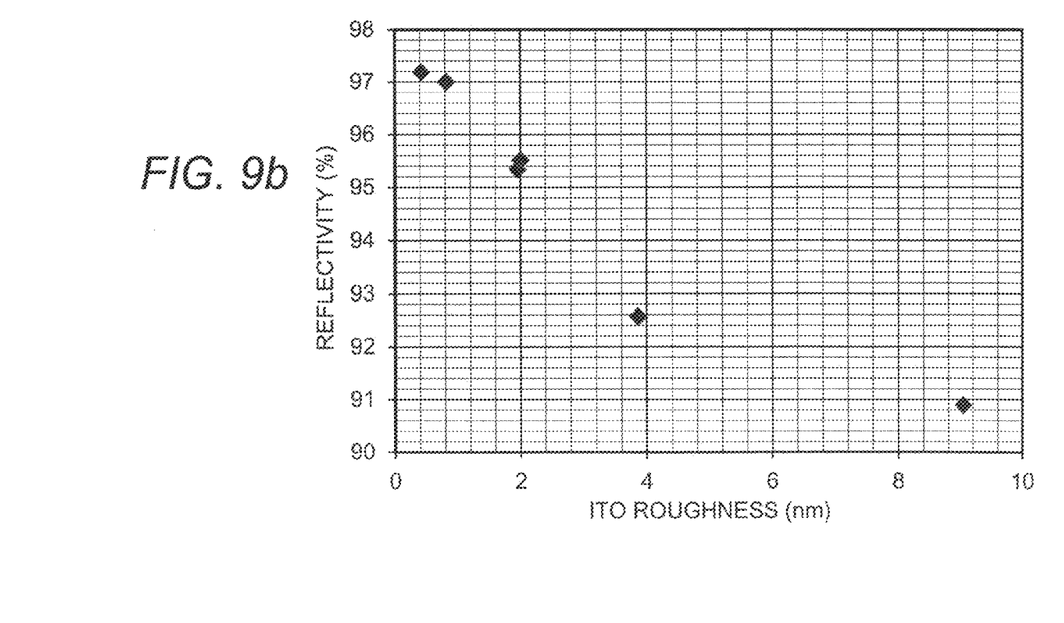

FIGS. 9(a,b) show a table of data for six CHRM samples manufactured according to the previous specifications (9a) and a graph of the experimental data (9b). The CHRM devices comprise ITO layers having thicknesses of 55 nm and 110 nm, followed by dielectric and reflective cap layers similar to the layers shown in FIG. 8. The RMS roughness of the ITO layer was measured using an atomic force microscope before and after the polish etch was performed. The ITO layer absorption was measured before and after the polish etch and is averaged over the 440-480 nm wavelength range. In general, the ITO absorption is low and not significantly impacted by the polish etch. Once the CHRM was complete, the reflectivity values were measured, averaged over the 455-465 nm range. The graphic data show that for each of the samples the normal angle reflectivity of the CHRM increased with reduced RMS roughness at the ITO/SiO2 interface. In general, longer etch times result in lower RMS roughness and higher CHRM reflectivity. However, longer etch times also result in higher sheet resistances ($R_{sheet}$). Thus, the increased sheet resistance may need to be considered when selecting an optimal etch time for a given CHRM design.

Figures 10, 11:
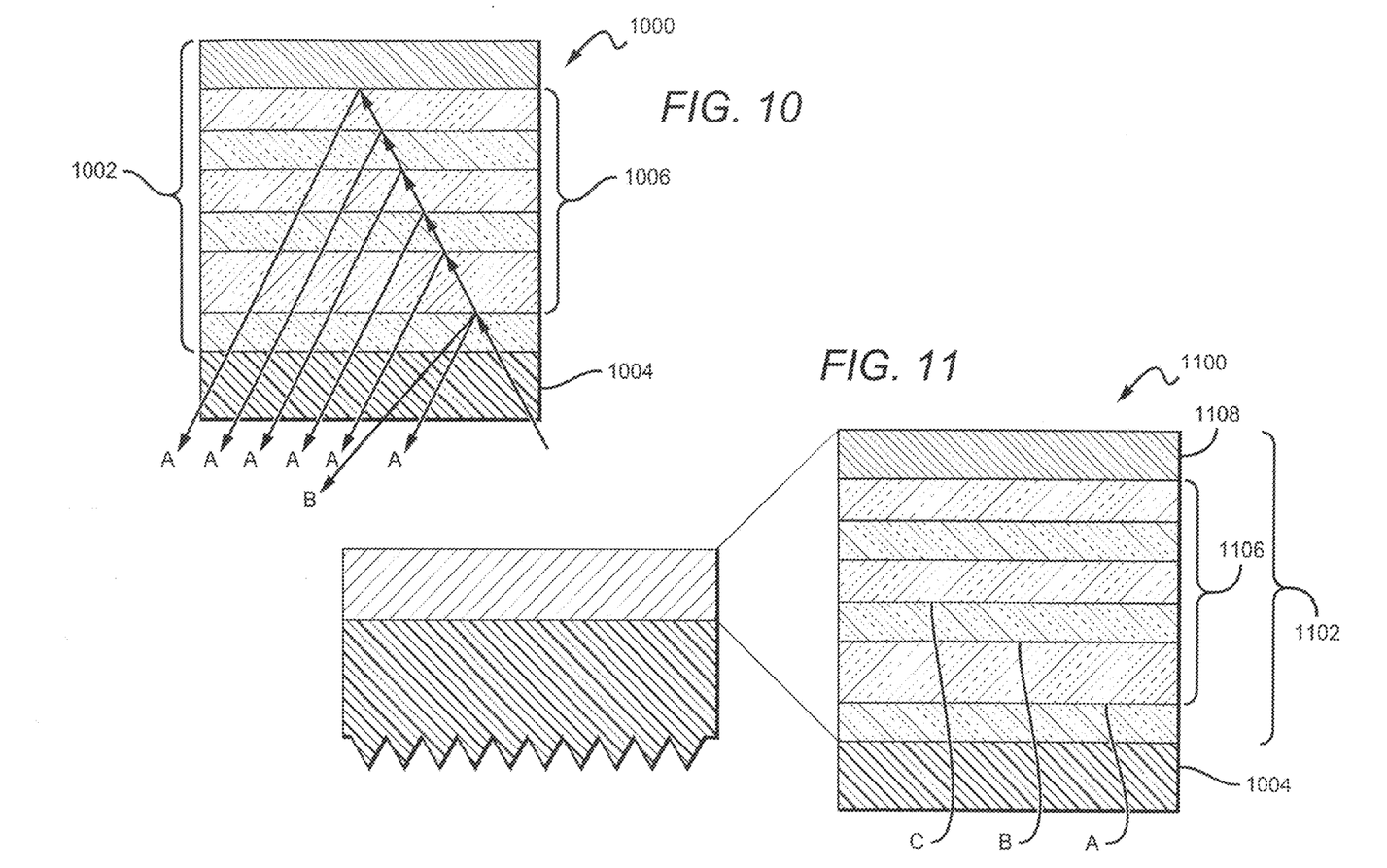
FIG. 10 is a cross-sectional view of a portion of an LED device according to an embodiment of the present invention.
FIG. 11 is a cross-sectional view of a portion of an LED device according to an embodiment of the present invention.

The data from FIGS. 9(a,b) shows an improvement in normal angle reflectivity of CHRM devices on a sapphire substrate when applying a polish etch to the ITO/SiO2 interface. An improvement can also be expected for the specular reflection of light incident at any angle. FIG. 10 is a cross-sectional view of a portion of an LED 1000 with an integral CHRM structure 1002 according to an embodiment of the present invention. A CHRM 1002 such as the one shown in FIG. 7, is deposited on a p-type semiconductor layer 1004, for example p-GaN, opposite the active region (not shown). In the LED 1000, light that is scattered at a rough interface in the CHRM 1002 which is reflected back into the p-type layer 1004 at an angle (B) different from the specular reflection (A) is not necessarily lost. There is a chance that non-specular reflected light (B) will escape the LED 1000 and contribute to the output. However, because the layers of the dielectric layer 1006 are designed to maximize the specular reflection through constructive interference, it is unlikely that the scattered light (B) will interfere with specular reflected light (A) constructively. Light scattering within the CHRM 1002 is thus likely to reduce optical output.

By applying a polish etch, it is possible to reduce the roughness of many of the interfaces within CHRM and increase the light output. As discussed above with reference to FIGS. 7-9, it is beneficial to apply a polish etch to the base element (e.g., the current spreading layer) to create a smoother interface with the dielectric layer. Because it is typically the roughest interface to begin with, the base element/dielectric layer interface is the preferred area for polishing. For example, in the embodiment where ITO is used as a current spreading layer, it can have roughness after an annealing process on the order of 10 nm RMS for a 110 nm thick film. However, other internal surfaces of the device may also be polished to achieve improved optical output as illustrated in FIG. 11.

FIG. 11 shows a cross-sectional view of a GaN LED 1100 with an internal CHRM structure 1102 according to an embodiment of the present invention. This particular embodiment features a multi-layer dielectric stack 1106 and a reflective cap layer 1108. In this structure one or more of the interfaces between the various layers (e.g., surfaces A, B or C) can be polished. The thicker a layer is, the rougher its surface tends to be. Therefore, it follows that it may be more effective to polish the surface of the thicker layers within the CHRM 1102. Several combinations of polished surfaces are possible.

It is understood that CHRM devices according to the present invention can have many different layers of different materials and thicknesses. In some embodiments the composite layer can comprise layers made of conductive materials such as conductive oxides. The conductive oxide layers can have different indices of refraction and differing thicknesses to provide the improved reflectivity. The different embodiments can have different arrangements of complete and incomplete pairs of first and second material layers. It is also understood that the CHRM can be arranged in different locations in an LED and can comprise different features to provide thermal or electrical conduction through the composite layer.

FIGS. 12(a-d) show cross-sectional views of another embodiment of an LED 120 having an integral CHRM structure.

Figure 12A:
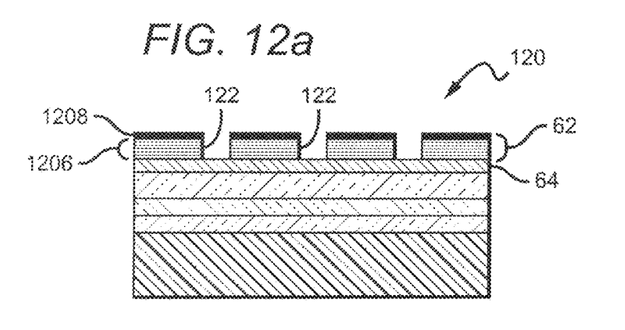
Figure 13:
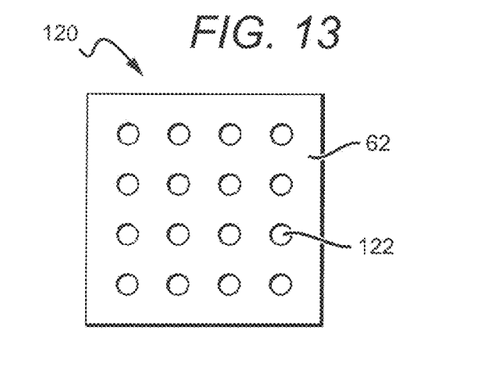
FIG. 13 is a top plan view of a dielectric layer within a CHRM according to an embodiment of the present invention.
Figure 14:
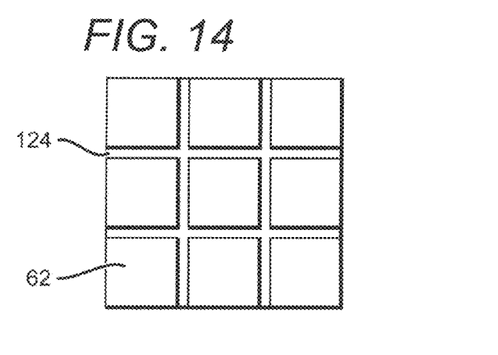
FIG. 14 is a top plan view of a dielectric layer within a CHRM according to an embodiment of the present invention.

FIG. 12a illustrates LED 120 with an integral CHRM structure comprising a current spreading layer 64 and the composite structure 62. The composite structure 62 includes one or more dielectric layers 1206 and a reflective cap layer 1208. In this embodiment, one or more of the surfaces of the current spreading layer 64 and the composite structure 62 can be polished to increase output efficiency as discussed at length above. The LED 120 is fabricated such that it can be arranged in a flip-chip orientation, so for this embodiment the end LED chip will have the dielectric layer arranged as an internal layer as further described below. Accordingly, an electric signal should pass through the composite structure 62. Referring now to FIG. 13 and FIG. 14, holes 122 can be formed through the composite structure 62 at random or regular intervals, with the holes sized and positioned so that a conductive material can be deposited in the holes to form conductive vias. In the embodiment shown the holes 122 are at regular intervals.

In different embodiments in which the base element comprises a current spreading layer, the holes 122 may or may not pass through the current spreading layer. The holes 122 can be formed using many known processes such as conventional etching processes or mechanical processes such as microdrilling. The holes 122 can have many different shapes and sizes, with the holes 122 in the embodiment shown having a circular cross-section with a diameter of approximately 20 microns. Adjacent holes 122 can be approximately 100 microns apart. It is understood that the holes 122 (and resulting vias) can have cross-section with different shapes such as square, rectangular, oval, hexagon, pentagon, etc. In other embodiments the holes do not have uniform size and shape, and there can be different spaces between adjacent holes.

Referring now to FIG. 14, instead of holes an interconnected grid 124 can be formed through the composite structure, with a conductive material then being deposited in the grid 124 to form the conductive path through the composite structure. The grid 124 can take many different forms beyond that shown in FIG. 14, with portions of the grid interconnecting at different angles in different embodiments. An electrical signal applied to the grid 124 can spread along the interconnected portions. It is further understood that in different embodiments a grid can be used in combination with holes.

Figure 12B:
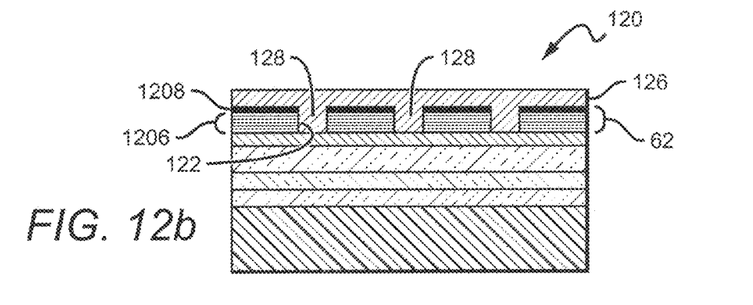

Referring now to FIG. 12b, a conductive layer 126 can be deposited on the CHRM covering the reflective cap layer 1208 and extending into the holes 122 to form vias 128 through the composite structure 62. In other embodiments, the conductive layer 126 can cover less than all of the reflective cap layer 1208. The conductive layer 126 can comprise many different materials such as metals or conductive oxides, both of which can be deposited using known techniques.

Figure 12C:
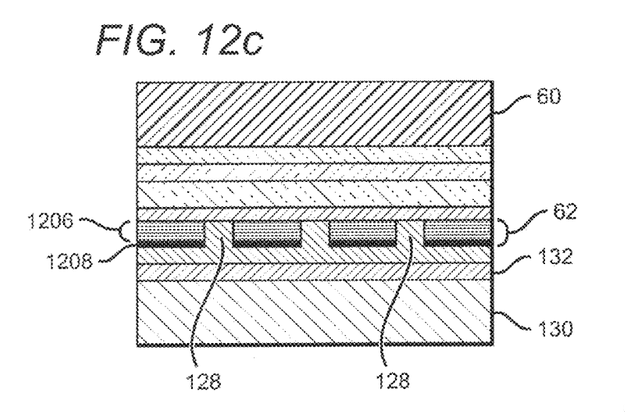

Referring now to FIG. 12c, the LED 120 can be flip-chip mounted to a submount 130 using known mounting techniques. In the embodiment shown, the LED 50 is flip-chip mounted to the submount 130 by a conductive bond material 132. It is understood that in embodiments where the LEDs chips are formed at the wafer level and then singulated, the LEDs chips can be wafer bonded to the submount 130 using known wafer bonding techniques. The submount 130 can be made of many different materials and can have many different thicknesses, with a suitable submount 130 being electrically conductive so that an electrical signal can be applied to the active region of the LED through the submount 130. The signal also passes through the CHRM along conductive vias 128.

Figure 12D:
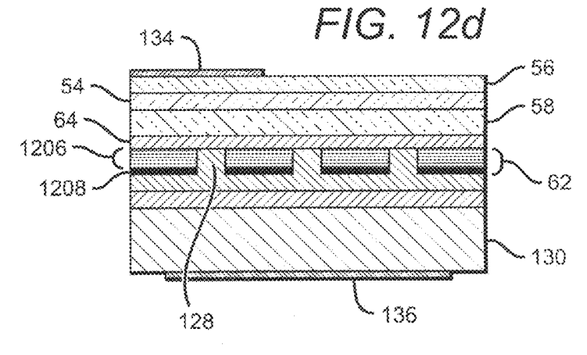

Referring now to FIG. 12d, the growth substrate 60 (as shows in FIG. 12c) can be removed using known grinding and/or etching processes. A first contact 134 can be deposited on the n-type layer 56 and a second contact 136 can be deposited on the submount 130. The first and second contacts 134, 136 can comprise many different materials such as Au, copper (Cu) nickel (Ni), indium (In), aluminum (Al), silver (Ag), or combinations thereof. In still other embodiments the first and second contacts 134, 136 can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity, and sheet resistance. The top surface of the n-type layer 56 can be textured or shaped such as by laser texturing, mechanical shaping, etching (chemical or plasma), scratching or other processes, to enhance light extraction.

During operation, an electrical signal is applied to the LED 50 across first and second contacts 134, 136. The signal on the first contact 134 spreads into the n-type layer 56 and to the active region 54. The signal on the second contact 136 spreads into the submount 130, through composite structure 62 along the vias 128, through the current spreading layer 64, into the p-type layer 58 and to the active region 54. This causes the active region 54 to emit light, and the composite structure 62 is arranged to reflect light emitted from the active region 54 toward the p-type layer 58, or reflected by TIR toward the submount 130 and back toward the top of the LED chip. The CHRM encourages emission toward the top of the LED chip and because of its improved reflectivity, reduces losses that occur during reflection.

Figure 15:
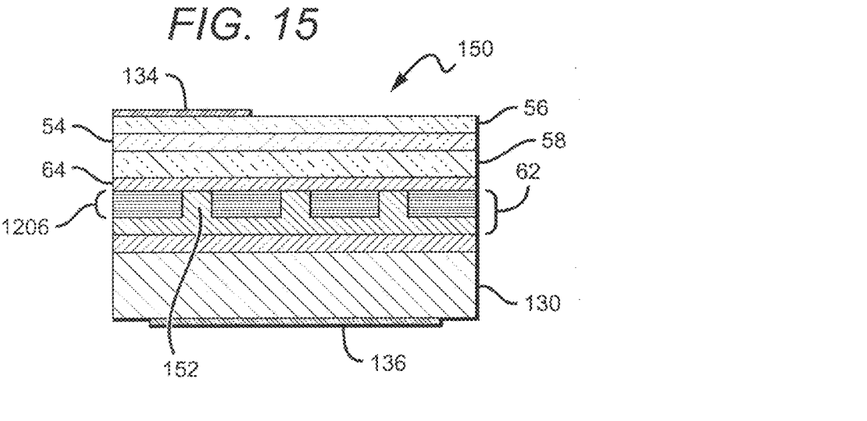
FIG. 15 is a cross-sectional view of an LED device according to an embodiment of the present invention.

FIG. 15 shows another embodiment of an LED 150 with an integral CHRM structure comprising a current spreading layer 64 and the composite structure 62. The composite structure 62 includes one or more dielectric layers 1206 and a reflective cap layer 152. The LED 150 is similar to the LED 120 shown in FIG. 12*d* and comprises many of the same elements. However, in this embodiment the reflective cap layer 152 serves simultaneously as a conductive layer by extending beyond the surface of the dielectric layer 120*b* and into the holes through to the conductive layer 64 as shown. Thus, a suitable material for the reflective cap layer 152 should be both reflective and conductive. Many materials are known to possess both of these characteristics.

In different embodiments of the present invention the vias can serve additional purposes beyond conducting electrical signals. In some embodiments the vias can be thermally conductive to assist in thermal dissipation of heat generated by the LED. Heat can pass away from the LED through the vias where it can dissipate.

Figure 16:
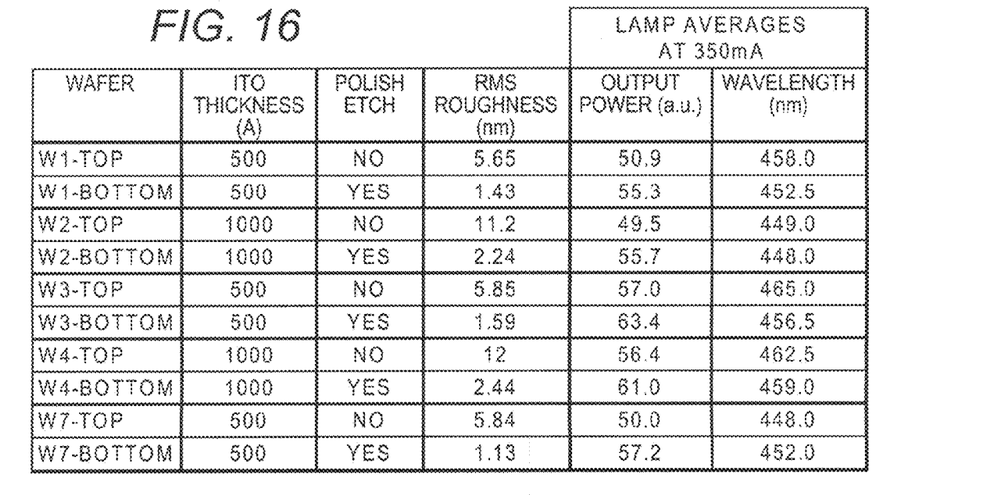
FIG. 16 is a table of experimental data relating to the output power of LEDs fabricated with and without a polish step.

FIG. 16 is a table of experimental data showing the output power (i.e., brightness) from several LED samples. The structure of the LEDs is similar to that shown in FIGS. 11, 12 and 15. The experiments were conducted with an on-wafer split: half of the wafer was subject to a polish etch prior deposition of the dielectric stack; the other half of the wafer was not polished. All other fabrication steps were performed on the whole wafer. The RMS roughness was characterized using AFM as discussed with regard to FIG. 6. The polish step resulted in an increase in the output power for each of the wafers tested. On average, the output power increased approximately 10%.

Although the present invention has been described in detail with reference to certain preferred configurations thereof, other versions are possible. Therefore, the spirit and scope of the invention should not be limited to the versions described above.

We claim:

1. A light emitting diode (LED), comprising:
    a light emitting structure;
    a current spreading layer on said light emitting structure comprising a smooth surface, wherein said current spreading layer smooth surface has a root mean square (RMS) roughness of not more than 1 nm;
    a plurality of dielectric layers on said smooth surface of said current spreading layer opposite said light emitting structure, wherein an interface between two of said dielectric layers is smooth, said plurality of dielectric layers comprising first and second materials arranged in alternating layers on said current spreading layer, said second material comprising tantalum pentoxide (Ta2O5), wherein any layer of said first material closer to said current spreading layer is thicker than any layer of said first material farther from said current spreading layer and any layer of said second material closer to said current spreading layer is thicker than any layer of said second material farther from said current spreading layer; and
    a reflective layer on one of said dielectric layers opposite said current spreading layer.

2. The LED of claim 1, said light emitting structure comprising an active region interposed between a p-type semiconductor layer and an n-type semiconductor layer.

3. The LED of claim 2, wherein said current spreading layer is on said p-type semiconductor layer opposite said active region.

4. The LED of claim 1, said light emitting structure comprising Group-III nitride materials.

5. The LED of claim 1, wherein said current spreading layer provides a reflectivity viewing angle cut-off above which said plurality of dielectric layers reflectivity is approximately 100%.

6. The LED of claim 5, wherein said plurality of dielectric layers provide improved reflectivity below said viewing angle cut-off compared to a similar LED without said at least one dielectric layer.

7. The LED of claim 1, wherein said first material comprises silicon dioxide ($SiO_2$).

8. The LED of claim 1, further comprising conductive vias through said at least one dielectric layer.

9. The LED of claim 1, said light emitting structure comprising:
    at least two oppositely doped semiconductor layers;
    an active region interposed between said at least two oppositely doped semiconductor layers; and
    a substrate disposed such that said current spreading layer is on said substrate.

10. The LED of claim 1, said reflective layer comprising a metal.

11. The LED of claim 1, said reflective layer comprising a conductive material and electrically contacting said current spreading layer.

12. The LED of claim 1, said reflective layer comprising at least one conductive via through said at least one dielectric layer to said current spreading layer.

* * * * *